(12) United States Patent
Lavoie et al.

(10) Patent No.: US 7,704,895 B2
(45) Date of Patent: Apr. 27, 2010

(54) DEPOSITION METHOD FOR HIGH-K DIELECTRIC MATERIALS

(75) Inventors: Adrien R. Lavoie, Beaverton, OR (US); John J. Plombon, Portland, OR (US); Juan E. Dominguez, Hillsboro, OR (US); Harsono S. Simka, Saratoga, CA (US); Mansour Moinpour, Saratoga, CA (US)

(73) Assignee: Intel Corporation, Santa Clara, CA (US)

( * ) Notice: Subject to any disclaimer, the term of this patent is extended or adjusted under 35 U.S.C. 154(b) by 53 days.

(21) Appl. No.: 12/061,584

(22) Filed: Apr. 2, 2008

(65) Prior Publication Data
US 2009/0253270 A1 Oct. 8, 2009

(51) Int. Cl.
*H01L 21/473* (2006.01)

(52) U.S. Cl. ............... 438/782; 438/785; 257/E21.494; 427/353

(58) Field of Classification Search ........... 257/E21.494
See application file for complete search history.

(56) References Cited

U.S. PATENT DOCUMENTS 5,855,754 A * 1/1999 Wiengarten et al. ......... 204/484
2005/0191515 A1* 9/2005 Brese et al. ................. 428/633

OTHER PUBLICATIONS

United States Patent Application, pending—not yet published, U.S. Appl. No. 11/648,006, filed Dec. 28, 2006, to Lavoie et al.

* cited by examiner

*Primary Examiner*—Stephen W Smoot
(74) *Attorney, Agent, or Firm*—John N. Greaves

(57) ABSTRACT

A method for depositing a high-k dielectric material on a semiconductor substrate is disclosed. The method includes applying a chemical bath to a surface of a substrate, rinsing the surface, applying a co-reactant bath to the surface of the substrate, and rinsing the surface. The chemical bath includes a metal precursor which includes at least a hafnium compound, an aluminium compound, a titanium compound, zirconium compound, a scandium compound, a yttrium compound or a lanthanide compound.

10 Claims, 1 Drawing Sheet

DEPOSITION METHOD FOR HIGH-K DIELECTRIC MATERIALS

BACKGROUND

1. Technical Field

Embodiments of the invention relate to liquid phase deposition of a high-k dielectric material on a semiconductor substrate.

2. Description of Related Art

Dielectric materials with high dielectric constant (high-k) are desirable for use as gate dielectrics in semiconductor devices.

Conventional methods of depositing a high-k dielectric film on a semiconductor substrate include physical vapor deposition (PVD), chemical vapor deposition (CVD) and atomic layer deposition (ALD). ALD is a gas-phase thin film deposition method based on alternate saturative surface reactions.

In ALD, separate pulses of reactive vapor streams are led to a process chamber containing a semiconductor substrate, where the pulses can be separated by purging or evacuating. During each pulse, a self-limited chemisorbed layer is formed on the surface of the semiconductor substrate. The reaction chamber is then purged or evacuated to remove traces of non-chemisorbed first reactant from the gas phase. In the next pulse, the chemisorbed layer is exposed to a second reactant which forms a thin film of dielectric material on the semiconductor substrate. This cycle may be repeated until a desired thickness is obtained for the dielectric material deposited onto the substrate. Although the ALD method may have advantages over the PVD and CVD methods, the ALD method still suffers from problems with film quality, film continuity and film contamination.

DETAILED DESCRIPTION

Figure 1:
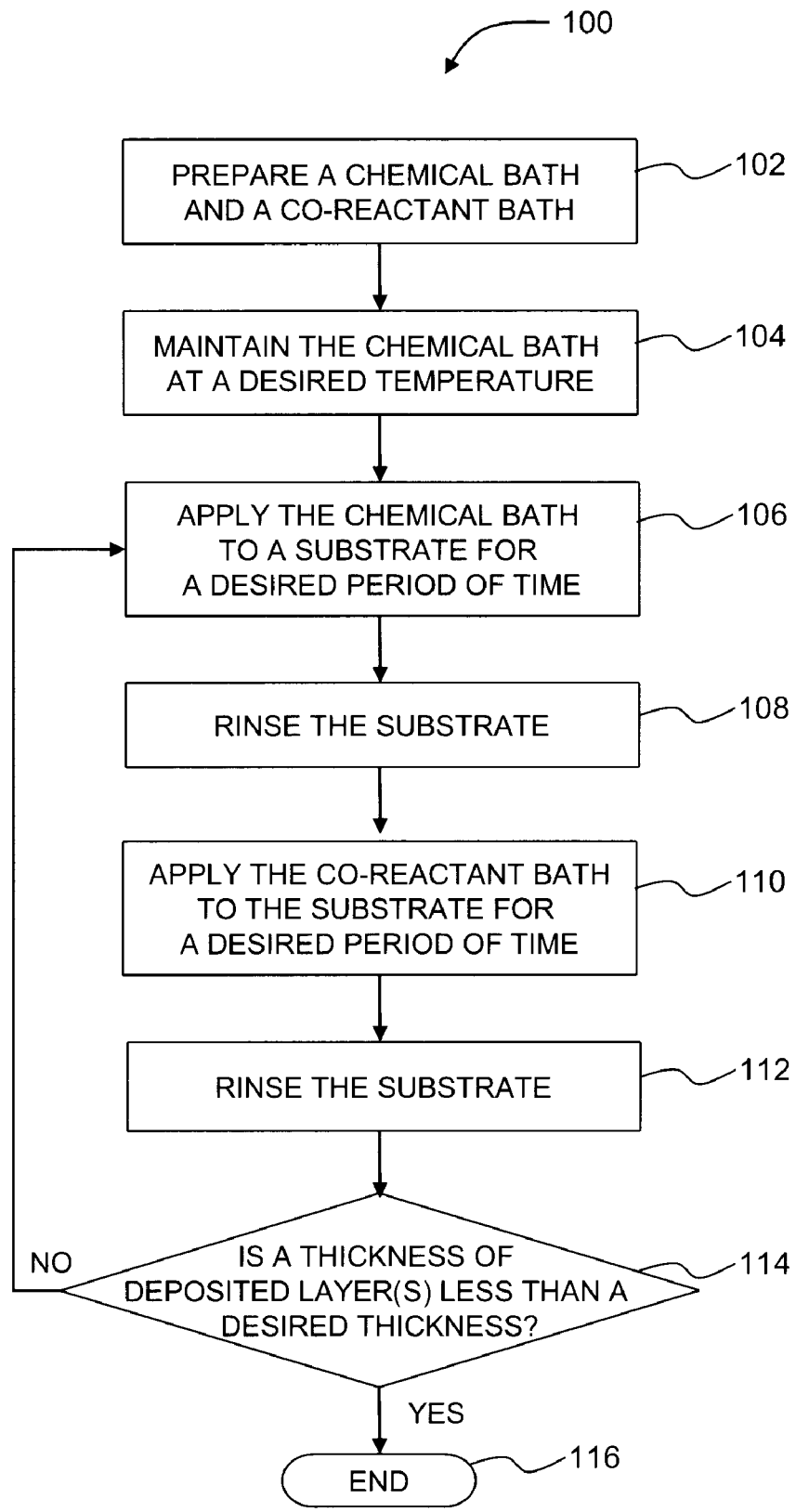
FIG. 1 illustrates a liquid phase method of depositing a high-k dielectric material according to one embodiment of the invention.

In the following description, numerous specific details are set forth in order to provide a thorough understanding of various illustrative embodiments of the present invention. It will be understood, however, to one skilled in the art, that embodiments of the present invention may be practiced without some or all of these specific details. In other instances, well known process operations have not been described in detail in order not to unnecessarily obscure pertinent aspects of embodiments being described. In the drawings, like reference numerals refer to same or similar functionalities or features throughout the several views.

Embodiments of the invention relate to liquid phase deposition of a metal oxide to provide a high-k dielectric layer on a semiconductor substrate. The deposition method involves applying chemical and co-reactant baths separated by rinsing baths to deposit stacked layers of a metal oxide until a desired thickness is obtained. The chemical bath includes a metal precursor which is selected to provide the metal oxide layer with a desirable work function, e.g., at least about 21 eV with proper conduction and valence band offset to the substrate, e.g., silicon wafer. This work function range is particularly desirable in gate dielectric applications. Further, the deposited metal oxide layer is particularly advantageous in providing single atomic smooth layer with improved density, stoichiometry, contaminant level, and film continuity or step coverage.

FIG. 1 illustrates a liquid phase method 100 of depositing a high-k dielectric material according to one embodiment of the invention. The method 100 begins with preparing a chemical bath and a co-reactant bath (block 102). The chemical bath is prepared by dissolving a metal precursor in an organic solvent at a desired concentration. The metal precursor is suitably selected to include at least a hafnium compound, an aluminium compound, a titanium compound, zirconium compound, a scandium compound, a yttrium compound or a lanthanide compound (i.e., any compound derived from the lanthanides). Examples of such compounds include, but are not limited to, $Al_2Me_6$, $[(C_4H_9)C_5H_4]_2HfCl_2$, $(C_5H_5)Hf(CH_3)_2$, $(C_5H_5)HfCl_2$, $[(C_5H_4)(C_2H_5)]_2HfCl_2$, $HfCl_4$, $Hf[OC(CH_3)_3]_4$, $HfBr_4$, $Hf_4O(OC_2H_5)_{14}\cdot 2C_2H_5OH$, $HfI_4$, $HfO_2$, $(CH_3)_5C_5HfCl_3$, $HfMe_4$, $Hf(NEt_2)_4$, $Cp_2Hf(CO)_2$, $TiCl_4$, $TiMe_4$, $Cp_2Ti(CO)_2$, $CP_2TiCl_2$, $Ti(NEt_2)_4$, $ZrCl_4$, $ZrMe_4$, $Cp_2Zr(CO)_2$, $Cp_2ZrCl_2$, $Zr(NEt_2)_4$, $YCp_3$, $Yb(FOD)_3$, $YCl_3$, $YBr_3$, $Sc(acac)_3$, $ScCp_3$, $Sc(FOD)_3$, $ScCl_3$, $ScBr_3$, a lanthanide oxide (derived from La, Ce, Pr, Nd, Pm, Sm, Eu, Gd, Tb, Dy, Ho, Er, Tm, Yb or Lu), $Ln(acac)_3$, $LnCp_3$, $Ln(FOD)_3$, $LnCl_3$, $LnBr_3$, $Ln(acac)_3$, $Ln(thd)_3$, $Ln(CpMe)_3$, $Ln(tBu_2amd)_3)$, $Ln(thd)_4$ and $Ln(thd)_3(phen)$ compounds. In the above precursors, the following common abbreviations are used, namely, Me: methyl; Et: ethyl; Bu: butyl; tBu: tert-butyl; Cp: cyclopentadienyl; THD: 2,2,6,6-tetramethyl-3,5-heptanedionate; FOD: 6,6,7,7,8,8,8-heptafluoro-2,2-dimethyl-3,5-octanedionate; acac: 2,4-pentanedionate; phen: phenanthroline; amd: amidinate or guanidinate ligands; Ln: lanthanide.

The metal precursor may be dissolved in any of various organic solvents including, though not limited to, toluene, diethyl ether, dichloromethane, chloroform, and tetrahydrofuran. Other examples of a suitable organic solvent include, but are not limited to, acetone, acrylamide, benzene, carbon disulfide, ethylene oxide, n-hexane, hydrogen sulfide, methanol, methyl mercaptan, methyl-N-butyl ketone, organochlorine, organophosphates, perchloroethene, styrene, methyl chloroform, trichloroethene, vinyl chloride, acetonitrile, dimethylformamide, dimethylsulfoxide, mesitylene, hexanes, decane, octane, nonane, diethylether, tetrahydrofuran, and xylene.

The metal precursor is dissolved in the selected organic solvent at the desired concentration depending on the requirements of the application. In certain embodiments, the concentration of the metal precursor in the organic solvent may range between about 0.001 Molar (M) to about 0.1 Molar.

A co-reactant bath is also prepared which includes an oxidizing agent dissolved in an aqueous solution. Examples of the oxidizing agent include, but are not limited to, water, oxygen in water, ozone in water $H_2O_2$, chromate ions, perchromate, manganate, permanganate ions. In certain embodiments, the concentration of the oxidizing agent in an aqueous solution may range between about 0.001M to about 0.1M. Alternatively, the aforementioned oxidizing agents may be combined with organic solvents including, though not limited to, toluene, diethyl ether, dichloromethane, chloroform, tetrahydrofuran, acetone, acrylamide, benzene, carbon disulfide, ethylene oxide, n-hexane, hydrogen sulfide, methanol, methyl mercaptan, methyl-N-butyl ketone, perchloroethene, styrene, methyl chloroform, trichloroethene, vinyl chloride, acetonitrile, dimethylformamide, dimethylsulfoxide.mesitylene, hexanes, decane, octane, nonane, diethylether, tetrahydrofuran, and xylene.

Prior to applying the various baths to a semiconductor substrate to form a metal oxide thereon, the chemical bath is warmed and maintained at a desired process temperature (block 104). In certain embodiments, the process temperature is maintained at between about 25° C. to about 90° C. depending on required reactivity.

Subsequently, the chemical bath is applied to a surface of a semiconductor substrate, e.g., silicon wafer (block 106). Application of the chemical bath may be performed in various ways including, but not limited to, immersing the substrate into the bath, spraying the bath at the substrate. In certain embodiments where the substrate is immersed in the chemical bath, agitation of the bath may be desired. Depending on requirements, the chemical bath may be applied to the semiconductor substrate for a time duration of between about 2 seconds to about 3600 seconds. With the application of the chemical bath to a surface of the substrate, an adsorbed layer of the metal precursor is formed on the surface of the substrate.

The substrate is then removed from the chemical bath and rinsed with a solvent to remove traces of unreacted chemical bath from the substrate (block 108). The rinsing solvent may be the same which was selected for the chemical bath. Alternatively, the rinsing solvent may be selected from the organic solvents listed above.

The co-reactant bath may then be applied to the substrate, e.g., silicon wafer (block 110). Application of the co-reactant bath may be performed in various ways including, but not limited to, immersing the substrate into the bath and spraying the bath at the substrate. In certain embodiments where the substrate is immersed in the co-reactant bath, agitation of the bath may be desired. Depending on requirements, the co-reactant bath may be applied to the substrate for a time duration of between about 2 seconds to about 3600 seconds. The co-reactant bath includes an oxidizing agent which oxidizes the adsorbed metal layer to form a metal oxide layer on the substrate.

The substrate is then removed from the co-reactant bath and rinsed with a solvent to remove traces of the unreacted co-reactant bath from the substrate (block 112). The rinsing solvent may be the same which was selected for the chemical bath. Alternatively, the rinsing solvent may be selected from the organic solvents listed above.

The metal oxide is to provide a high-k dielectric material on the substrate. The sequence through blocks 106 to 112 may deposit a thin layer or film of the metal oxide in the range of 5 to 50 Angstroms. If a thickness of the deposited layer of metal oxide is less than a desired thickness (block 114), the sequence through blocks 106 to 112 may be repeated until the deposited layers of metal oxide, stacked upon one another, reach the desired thickness. If the thickness of the deposited layer(s) of metal oxide has reached the desired thickness, the sequence terminates (block 116). Furthermore, the layers or films can be processed after deposition to ensure uniform composition and/or adhesion, as well as purification of the films. This method also encompasses the deposition of bilayers or multilayers if a spray tool with different baths are used to alternatively deposit films.

Other embodiments will be apparent to those skilled in the art from consideration of the specification and practice of the present invention. Furthermore, certain terminology has been used for the purposes of descriptive clarity, and not to limit the invention. The embodiments and features described above should be considered exemplary, with the invention being defined by the appended claims.

What is claimed is:

1. A deposition method comprising:
applying a chemical bath to a surface of a substrate, the chemical bath including a metal precursor selected from the group consisting of a hafnium compound, an aluminium compound, a titanium compound, zirconium compound, a scandium compound, a yttrium compound and a lanthanide compound, wherein applying the chemical bath and applying the co-reactant bath is for a time duration until a metal oxide layer is deposited on the surface of the substrate, the metal oxide layer having a work function of at least about 21 eV;
rinsing the surface;
applying a co-reactant bath to the surface of the substrate; and rinsing the surface.

2. The method of claim 1, wherein the chemical bath is heated to a temperature between about 25° C. to about 100° C.

3. The method of claim 2, wherein applying a chemical bath to a surface of a substrate is for a time duration between about 2 seconds to about 3600 seconds.

4. The method of claim 3, wherein applying a co-reactant bath to the surface of the substrate is for a time duration between about 2 seconds to about 3600 seconds.

5. The method of claim 1, wherein applying a chemical bath and applying a co-reactant bath are by immersing the substrate into the chemical bath and the co-reactant bath respectively.

6. A deposition method comprising:
applying a chemical bath to a surface of a substrate, the chemical bath including a metal precursor selected from the group consisting of a hafnium compound, an aluminium compound, a titanium compound, zirconium compound, a scandium compound, a yttrium compound and a lanthanide compound;
rinsing the surface;
applying a co-reactant bath to the surface of the substrate; and rinsing the surface, wherein the metal precursor includes at least one of $Al_2Me_6$, $[(C_4H_9)C_5H_4]_2HfCl_2$, $(C_5H_5)Hf(CH_3)_2$, $(C_5H_5)HfCl_2$, $[(C_5H_4)(C_2H_5)]_2HfCl_2$, $HfCl_4$, $Hf[OC(CH_3)_3]_4$, $HfBr_4$, $Hf_4O(OC_2H_5)_{14}\cdot 2C_2H_5OH$, $HfI_4$, $HfO_2$, $(CH_3)_5C_5HfCl_3$, $HfMe_4$, $Hf(NEt_2)_4$, $Cp_3Hf(CO)_2$, $TiCl_4$, $TiMe_4$, $Cp_2Ti(CO)_2$, $Cp_2TiCl_2$, $Ti(NEt_2)_4$, $ZrCl_4$, $ZrMe_4$, $Cp_2Zr(CO)_2$, $CP_2ZrCl_2$, $Zr(NEt_2)_4$, $YCp_3$, $Yb(FOD)_3$, $YCl_3$, $YBr_3$, $Sc(acac)_3$, $ScCp_3$, $Sc(FOD)_3$, $ScCl_3$, $ScBr_3$, a lanthanide oxide (derived from La, Ce, Pr, Nd, Pm, Sm, Eu, Gd, Tb, Dy, Ho, Er, Tm, Yb or Lu), $Ln(acac)_3$, $LnCp_3$, $Ln(FOD)_3$, $LnCl_3$, $LnBr_3$, $Ln(acac)_3$, $Ln(thd)_3$, $Ln(CpMe)_3$, $Ln(tBu_2amd)_3$, $Ln(thd)_4$ or $Ln(thd)_3$ (phen) compounds.

7. A deposition method comprising:
applying a chemical bath to a surface of a substrate, the chemical bath including a metal precursor selected from the group consisting of a hafnium compound, an aluminium compound, a titanium compound, zirconium compound, a scandium compound, a yttrium compound and a lanthanide compound;
rinsing the surface;
applying a co-reactant bath to the surface of the substrate; and rinsing the surface, wherein the metal precursor is dissolved in an organic solvent.

8. The method of claim 7, wherein the organic solvent includes at least one of toluene, diethyl ether, dichloromethane, chloroform, tetrahydrofuran, acetone, acrylamide, benzene, carbon disulfide, ethylene oxide, n-hexane, hydrogen sulfide, methanol, methyl mercaptan, methyl-N-butyl ketone, perchloroethene, styrene, methyl chloroform, trichloroethene, vinyl chloride, acetonitrile, dimethylformamide, dimethylsulfoxide, mesitylene, hexanes, decane, octane, nonane, diethylether, tetrahydrofuran, or xylene.

9. A deposition method comprising:
applying a chemical bath to a surface of a substrate, the chemical bath including a metal precursor selected from the group consisting of a hafnium compound, an aluminium compound, a titanium compound, zirconium compound, a scandium compound, a yttrium compound and a lanthanide compound;
rinsing the surface;
applying a co-reactant bath to the surface of the substrate; and
rinsing the surface, wherein the co-reactant bath includes an oxidizing agent.

10. The method of claim 9, wherein the oxidizing agent is dissolved in either water, or an organic solvent which includes at least one of toluene, diethyl ether, dichloromethane, chloroform, tetrahydrofuran, acetone, acrylamide, benzene, carbon disulfide, ethylene oxide, n-hexane, hydrogen sulfide, methanol, methyl mercaptan, methyl-N-butyl ketone, perchloroethene, styrene, methyl chloroform, trichloroethene, vinyl chloride, acetonitrile, dimethylformamide, dimethylsulfoxide, mesitylene, hexanes, decane, octane, nonane, diethylether, tetrahydrofuran, or xylene.

* * * * *